(12) United States Patent
Adkisson et al.

(10) Patent No.: US 7,194,706 B2
(45) Date of Patent: Mar. 20, 2007

(54) DESIGNING SCAN CHAINS WITH SPECIFIC PARAMETER SENSITIVITIES TO IDENTIFY PROCESS DEFECTS

(75) Inventors: James W. Adkisson, Jericho, VT (US); Greg Bazan, Essex Junction, VT (US); John M. Cohn, Richmond, VT (US); Matthew S. Grady, Burlington, VT (US); Leendert M. Huisman, South Burlington, VT (US); Mark D. Jaffe, Shelburne, VT (US); Phillip J. Nigh, Williston, VT (US); Leah M. P. Pastel, Essex, VT (US); Thomas G. Sopchak, Williston, VT (US); David E. Sweenor, South Burlington, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 10/710,642

(22) Filed: Jul. 27, 2004

(65) Prior Publication Data

US 2006/0026472 A1   Feb. 2, 2006

(51) Int. Cl.
*G06F 17/50* (2006.01)
(52) U.S. Cl. .............................. 716/4; 716/2
(58) Field of Classification Search ............... None
See application file for complete search history.

(56) References Cited

U.S. PATENT DOCUMENTS

| 4,698,830 | A | 10/1987 | Barzilai et al. |
| 5,502,731 | A | 3/1996 | Meltzer |
| 5,544,173 | A | 8/1996 | Meltzer |
| 5,745,405 | A | 4/1998 | Chen et al. |
| 5,796,751 | A | 8/1998 | Kundu |
| 5,828,579 | A | * 10/1998 | Beausang ...................... 716/2 |

(Continued)

FOREIGN PATENT DOCUMENTS

EP          146661 A1       12/1986

OTHER PUBLICATIONS

Bazan et al., "Using Embedded Objects for Yield Modeling," ASMC May 4-6, 2004, IEEE, pp. 124-128.*

(Continued)

*Primary Examiner*—Leigh M. Garbowski
(74) *Attorney, Agent, or Firm*—Scully, Scott, Murphy & Presser, P.C.; Michael J. LeStrange

(57) ABSTRACT

A method is disclosed for designing scan chains in an integrated circuit chip with specific parameter sensitivities to identify fabrication process defects causing test fails and chip yield loss. The composition of scan paths in the integrated circuit chip is biased to allow them to also function as on-product process monitors. The method adds grouping constraints that bias scan chains to have common latch cell usage where possible, and also biases cell routing to constrain scan chain routing to given restricted metal layers for interconnects. The method assembles a list of latch design parameters which are sensitive to process variation or integrity, and formulates a plan for scan chain design which determines the number and the length of scan chains. A model is formulated of scan chain design based upon current state of yield and process integrity, wherein certain latch designs having dominant sensitivities are chosen for specific ones of the scan chains on the chip. The model is provided as input parameters to a global placement and wiring program used to lay out the scan chains. Test data on the chip is then analyzed to determine and isolate systematic yield problems denoted by attributes of a statistically significant failing population of a specific type of scan chain.

26 Claims, 6 Drawing Sheets

U.S. PATENT DOCUMENTS

| | | | |
|---|---|---|---|
| 6,106,568 A * | 8/2000 | Beausang et al. | 716/18 |
| 6,185,707 B1 * | 2/2001 | Smith et al. | 714/724 |
| 6,434,733 B1 * | 8/2002 | Duggirala et al. | 716/11 |
| 6,546,514 B1 | 4/2003 | Hayem et al. | |
| 6,651,197 B1 * | 11/2003 | Wildes et al. | 714/726 |
| 6,880,136 B2 * | 4/2005 | Huisman et al. | 716/4 |
| 7,007,214 B2 * | 2/2006 | Eustis et al. | 714/729 |
| 7,036,099 B2 * | 4/2006 | Cheng et al. | 716/4 |
| 2005/0138508 A1 * | 6/2005 | Huisman et al. | 714/726 |

OTHER PUBLICATIONS

Marinissen et al., "Creating Value Through Test," Design, Automation and Test in Europe Conference and Exhibition, IEEE 2003, pp. 402-407.*

Zorian, "Optimizing Manufacturability by Design for Yield," Jul. 14-16, 2004 IEEE/SEMI Int'l Electronics Manufacturing Technology Symposium, 4 pages.*

At-Speed Test Is Not Necessarlily An AC Test, by Jacob Savir and Robert Berry, Int'l Test Conf. 1991.

IBM Technical Disclosure Bulletin 8-86 p. 1234-1236, Measuring Process-Induced AC Chip Performance Variations Using SRLs.

IBM Technical Disclosure Bulletin 3-88 p. 288, Process Monitoring For LSSD Designs.

* cited by examiner

Current scan path cell and layer usage

Scan path chaining which groups latches of similar types

Latch content optimized cell content with latch specific defect

Layer optimized cell content with layer specific defects

DESIGNING SCAN CHAINS WITH SPECIFIC PARAMETER SENSITIVITIES TO IDENTIFY PROCESS DEFECTS

BACKGROUND OF INVENTION

1. Field of the Invention

The present invention relates generally to a method for designing scan chains in an integrated circuit chip with specific parameter sensitivities to identify fabrication process defects causing test fails and chip yield loss. The subject invention biases the composition of the integrated circuit chip scan paths to allow them to also function as on-product process monitors, and adds grouping constraints that bias scan chains to have common latch cell usage where possible, and also biases inter-cell routing to constrain scan chain routing to given restricted metal layers for interconnects. The grouping of structures with similar process sensitivities into a scan chain allows scan chain fails during test to be more easily correlated back to a subset of fabrication process steps and related root causes.

2. Discussion of the Prior Art

The semiconductor industry places a premium on the ability of new technologies to increase yields of semiconductor chips. Test and yield-enhancing methodologies that improve the yield of semiconductor chips are highly prized. One such methodology for yield characterization is the analysis of scan chain yield on specific chip products.

The present state of the art of designing scan chains is based primarily upon spatial considerations and scan chain length (e.g. 10,000 latches in a scan chain), which is the number of latches in a scan chain. In the current state of the art, scan chain design is not systematically coupled with fabrication process sensitivities. On occasion, a systematic failure of a scan chain design has been discovered to be dominated by a particular fabrication process feature or level, which provided insight into a systematic problem in the fabrication process. In the current state of the art, scan chain sensitivity to a specific process level is neither planned nor understood prior to test, but rather results from a post production analysis of yield data and scan chain design for a particular chip design.

SUMMARY OF INVENTION

The present invention provides a scan chain design and test methodology that simultaneously provides for desired test coverage, and provides information on the state of specific process levels by instituting an intelligent design methodology that enables an analysis of the yield information on the scan chains.

The present invention biases the composition of integrated circuit chip scan paths to allow them to also function as on-product process monitors. In the current state of the art, latches are assembled into scan chains based primarily upon their proximity and also upon functional output net routing in order to improve routability. The result is that there is no intentional correlation of scan chain content with regard to type of cell or device or with regard to layer usage for interconnects.

The present invention can also design subsets of scan chains to have common latch cell usage where possible, and/or also bias cell routing to constrain subsets of scan chains to given restricted metal layers for interconnects. The subsets of scan chains should provide useful diagnostic information even if only one half of the scan chains are designed pursuant to the present invention. However, some chip designs have scan chains that would not lend themselves to this approach.

The present invention pertains to the design of scan chain paths, which is separate from latch circuit design, and can provide useful diagnostic information even if only the interconnects of scan paths are designed pursuant to the present invention.

The present invention adds additional grouping constraints that bias scan chains to have common latch cell usage where possible, and/or also bias cell routing to constrain scan chain routing to given restricted metal layers for interconnects. The grouping of structures with similar process sensitivities into a scan chain allows scan chain fails during test to be more easily correlated back to a subset of fabrication process steps and related root causes.

The present invention increases the available diagnostic information that can be derived from scan fails during a scan chain test, and improves process defect monitoring by using actual product chips and wafers. Information gathered from scan chain tests when the scan chains are designed in this manner is more representative of actual product sensitivities than measurements made using kerf monitors, which are test structures formed on chips and wafers that are used for process and quality control in the prior art. The approach of the present invention adds more critical area for defect monitoring and can complement kerf structures. The critical areas on a chip may contain structures that are not available in the kerf or would not be affordable in the kerf. Circuit limited yield and process interactions with physical design elements are often not invisioned before they affect yield. The approach of the present invention may also require a lesser number of kerf structures on chips and wafers, thus resulting in less area on chips and wafers being required to provide for the kerf structures.

It is advantageous to have such integrated structures as they are available for testing after the wafers are diced, and as such can be used to diagnose module final test problems, field returns, module level reliability issues, etc., which is not the case for kerf monitors.

BRIEF DESCRIPTION OF DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

In the current state of the art, latches are wired together into scan chains to facilitate LSSD (level sensitive scan design) or other scan based testing. Latches in a design are gathered together to form scan chains based primarily upon physical design characteristics such as physical locality, voltage island affinity (the circuitry and components on a chip are frequently operated at several different voltage levels, and the various circuitry and components required to operate at a particular voltage level are frequently grouped together in one area of the chip), and scan chain length constraints.

Figure 1:
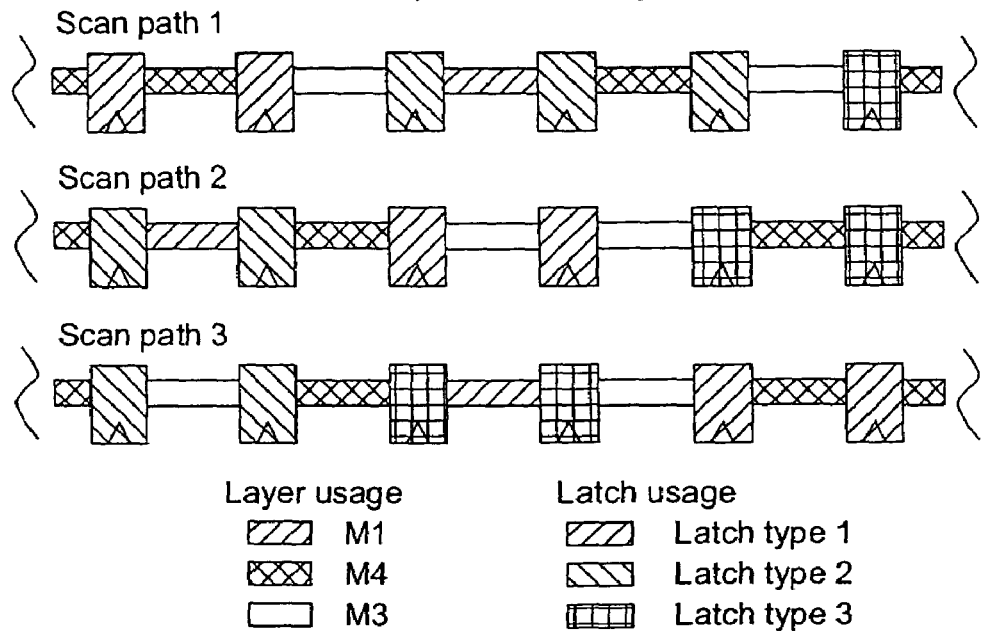
FIG. 1 illustrates typical scan chains in the current state of the art as being composed of a mixture of cell/latch usage and metal interconnect layer usage.

FIG. 1 illustrates typical scan chains in the current state of the art as being composed of a mixture of cell/latch usage and layer usage. Scan chain/path 1 includes, proceeding from left to right, metal layer M4, latch type 1, metal layer M4, latch type 1, metal layer M3, latch type 2, metal layer M1, latch type 2, metal layer M4, latch type 2, metal layer M3, latch type 3, and metal layer M4. Scan chain/path 2 includes, proceeding from left to right, metal layer M4, latch type 2, metal layer M1, latch type 2, metal layer M4, latch type 1, metal layer M3, latch type 1, metal layer M3, latch type 3, metal layer M4, latch type 3, and metal layer M4. Scan chain/path 3 includes, proceeding from left to right, metal layer M4, latch type 2, metal layer M3, latch type 2, metal layer M4, latch type 3, metal layer M1, latch type 3, metal layer M3, latch type 1, metal layer M4, latch type 1, and metal layer M4. Accordingly, the typical scan paths 1, 2 and 3 are composed of a mixture of cell/latch usage and layer usage.

The present invention augments this simple locality based clustering by adding a bias towards grouping structures with similar fabrication process sensitivities. This includes the choice of which latch cells are included in which scan chains as well as the choice of layers used to route the latch cells together.

Consider the idea of biasing scan chain composition by cell/latch type content. Different types of latches used in an ASIC library may have different sensitivities to process variations due to their specific layout. For example, a particular latch may have a specific sensitivity to contact under-etching due to a lack of redundant contacts. If a scan chain is created entirely from that particular type of latch, the resulting scan chain has a proclivity to contact under-etching due to the predisposition of that particular type of latch. If that scan path fails during test, contact under-etching would be a likely cause. By correlating this information with fail data from other scan chains, a diagnosis can be refined that points to the root cause, and can be used to guide failure analysis. For example, where specific scan chain fails point to a problem with a latch, additional scan chain fault isolation (diagnostics) can be performed to isolate the specific location of the defect causing the fail (which latch(es) are responsible for the scan chain failing).

Figure 2:
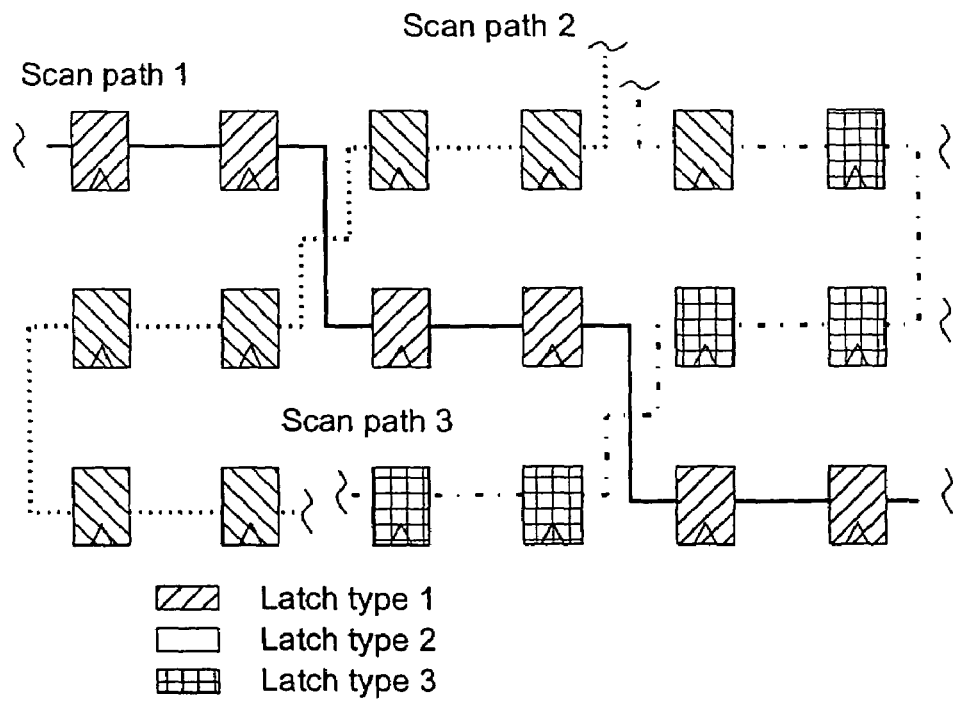
FIG. 2 illustrates a different set of scan chains for the same latch set of FIG. 1, which are designed to improve diagnosability by forming scan path chains of latches of similar types.
Figure 3:
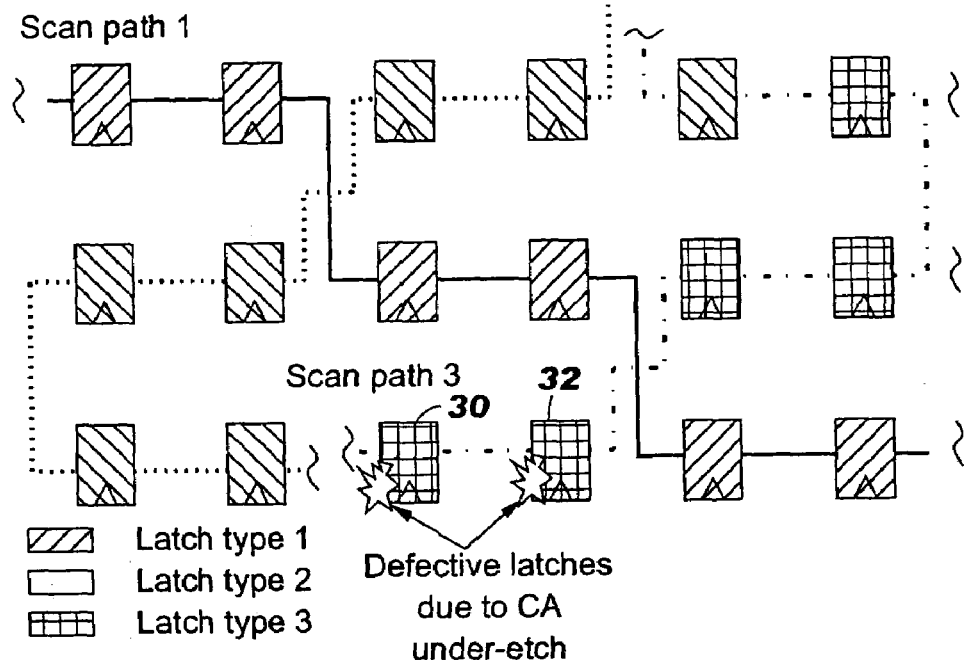
FIG. 3 illustrates a scan chain having a latch content optimized cell content, with a latch specific defect, and shows defective latches due to contact under-etching in scan path 3.

FIG. 2 illustrates a different chaining of the latch set of FIG. 1 to improve diagnosability. In FIG. 2, the chaining of the scan paths groups latches of similar types. Scan chain/path 1 includes six type 1 latches. Scan chain/path 2 includes six type 2 latches. Scan chain/path 3 includes five type 3 latches and one type 2 latch. Note that in this example it was not possible to compose all of scan path 3 out of the same latch type. This may be due to physical proximity, scan chain length limits, or any other overriding constraint on the scan path definition. This does not destroy the diagnostic value of the method. Because scan path 3 is still predominantly composed of latch type 3, a failure unique to latch type 3 is still a likely root cause in the event of a scan failure, as illustrated in FIG. 3. Mixing the latch content can lower the diagnostic confidence, but not always. It does make the analysis more complex. It may reduce the critical area, depending on the overall design of the chains. Experimental design often mixes variables and still can make sense of the results.

FIG. 3 illustrates scan chains having the same latch content optimized cell content as the scan chains of FIG. 2, with latch specific defects for the first latch 30 and the second latch 32 of scan path 3. The first and second defective latches of scan path 3 are due to contact under-etching in scan path 3.

Next consider restricting routing layer usage as a means to bias process sensitivity. By using existing methods similar to those used to bias clock routing (a clock signal from a clock frequently has different arrival times at different portions of a clock tree on a chip, which can skew the clock signals and adversely affect the chip performance, such that it is desirable to design the chip using bias clock routing, such as restricting the layer(s)/level(s) used to carry the clock signals, to minimize the effects of the different arrival times), it is possible to control the routing layers used to tie the latches together in a scan chain. This allows the scan path to be predisposed to specific defects associated with particular layer(s)/level(s). Scan chains designed in this way are more sensitive to specific process step variations and defects. The resulting scan chains are "tuned" to detect both known and unknown defects associated with their circuit content and critical area.

Figure 4:
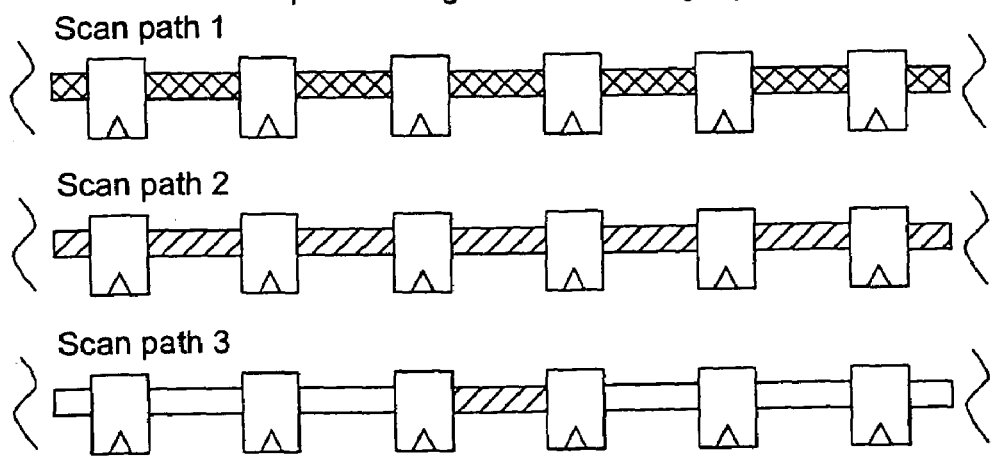
FIG. 4 illustrates scan paths using restricted wiring layers and shows a biasing scheme which attempts to restrict the wiring layers used on each scan path.

FIG. 4 illustrates scan paths using restricted wiring layers/levels and shows a biasing scheme which attempts to restrict the wiring layers/levels used on each scan path. Scan chain/path 1 includes six latches connected in wiring layer M2. Scan chain/path 2 includes six latches connected in wiring layer M1. Scan chain/path 3 includes connections between the first, second and third latches in wiring layer M3, and connections between the fourth, fifth and sixth latches in wiring layer M3, and the connection between the third and fourth latches in wiring layer M1. Note that in this example it has not proved possible to route all of scan path 3 on wiring layer/level M3. This may be due to routability limitations. Again, this constraint does not eliminate the diagnostic capability.

Figure 5:
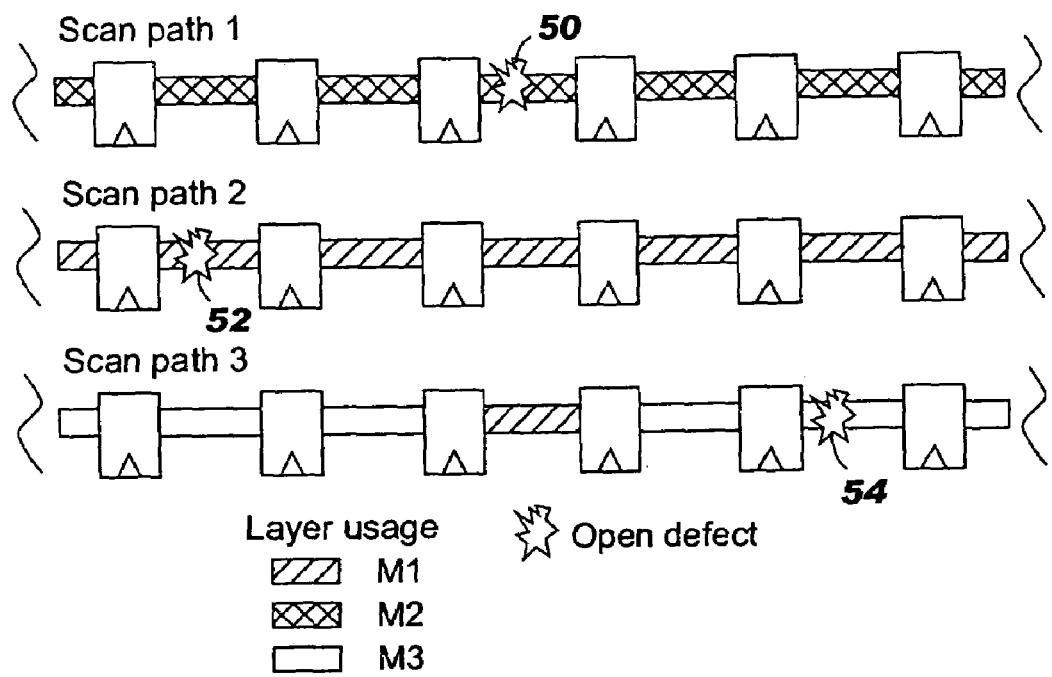
FIG. 5 illustrates scan paths having the same restricted wiring layer content as the scan paths of FIG. 4, with wiring layer defects in scan paths 1, 2 and 3 in respective metal layer M2, metal layer M1 and metal layer M3.

FIG. 5 illustrates scan chains having the same restricted wiring layer content as the scan chains of FIG. 4, with a wiring layer defect 50 in scan path 1, a wiring layer defect 52 in scan path 2, and a wiring layer defect 54 in scan path 3, in respective wiring layers M2, M1 and M3. Because scan path 3 is composed primarily of wiring layer/level M3, a failure on that path, as shown in FIG. 5, still makes a problem with wiring layer/level M3 a likely root cause.

Figure 6:
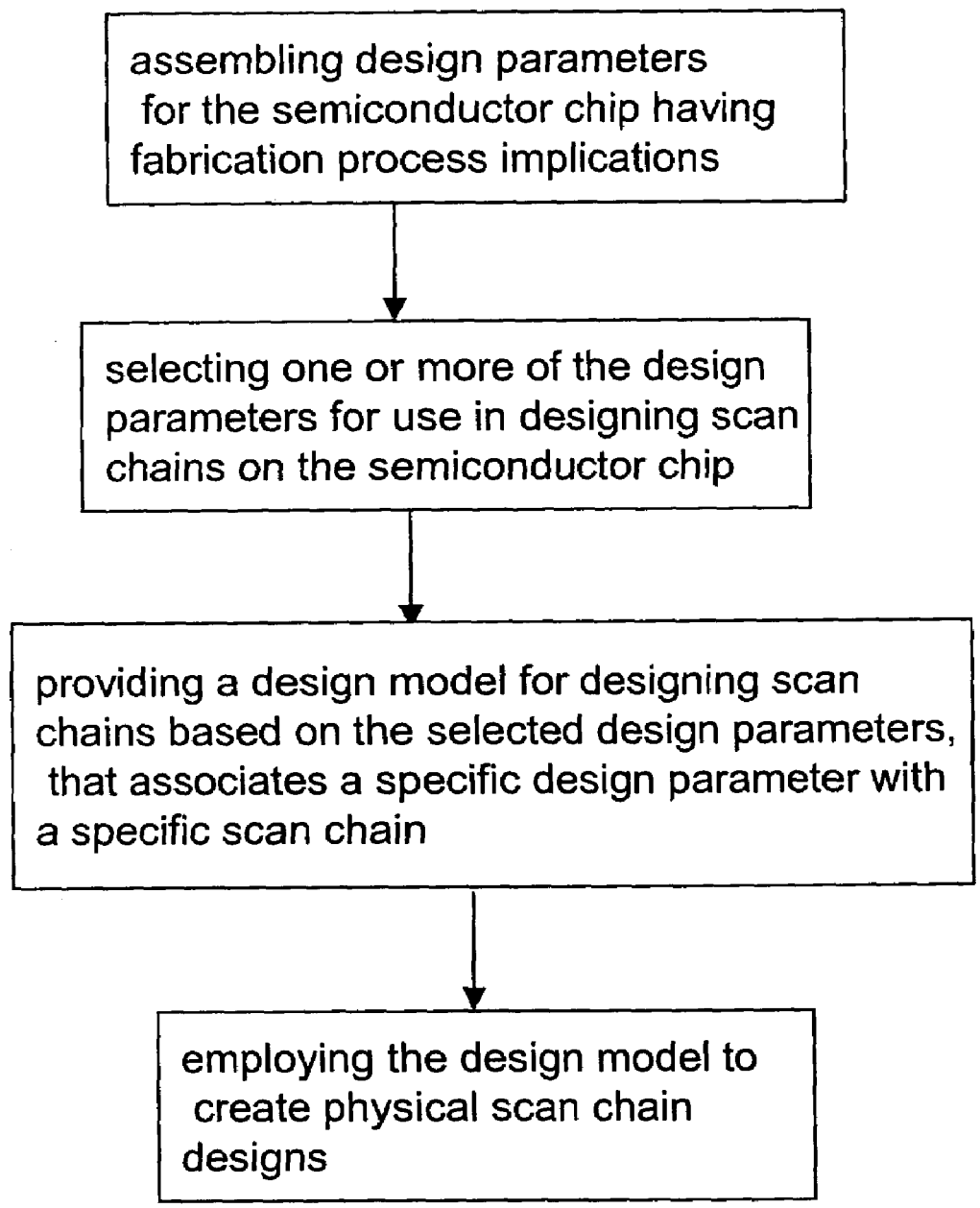
FIG. 6 depicts the methodology for designing scan chains in a semiconductor chip by considering fabrication process sensitivities according to one embodiment of the invention.
Figure 7:
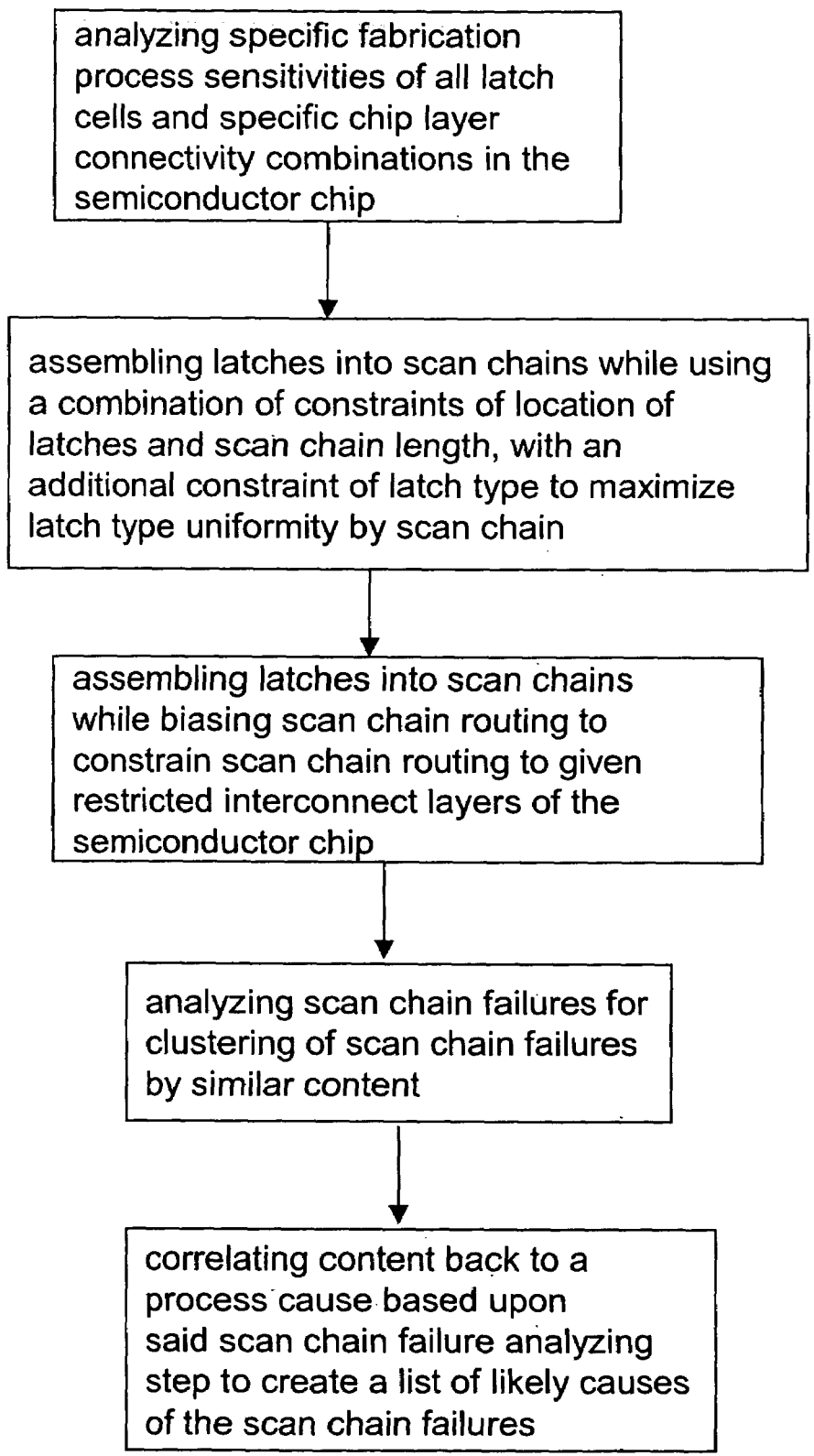
FIG. 7 depicts the methodology for designing scan chains in a semiconductor chip by considering fabrication process sensitivities according to a second embodiment of the invention.

As now described with respect to FIGS. 6 and 7, the the overall methodology of the present invention is as follows:

1. analyze specific fabrication process sensitivities of all latch cells and specific chip layer/level connectivity combinations;
2. cluster latches into scan chains using a combination of the existing location and scan length constraints, with an additional latch type constraint to maximize the latch uniformity by scan path;
3. optionally optimize step 2 to better balance scan chain content with routability, and other chip design constraints;
4. record latch type content by scan chain;
5. divide subsets of scan paths to be routed using restricted levels (this places a restriction only on subsets of a scan chain rather than an entire scan chain to balance routability against diagnosability);
6. assign layer subsets to these scan paths;
7. route these scan paths using restricted layer/level usage rules where possible, and relax rules where necessary to accommodate routability problems;
8. optionally optimize steps 5–7, scan path subset, and layer/level subset, based on routability analysis if needed;
9. record chip layer/level content by scan chain;
10. analyze scan chain failures for clustering by similar content, e.g. if four scan paths are failing all with a high content of metal layer/level M4;
11. correlate content back to process root cause based on the analysis in step 1 to create a list of likely root causes;
12. verify likely root cause using standard failure analysis methods.

Figure 8:
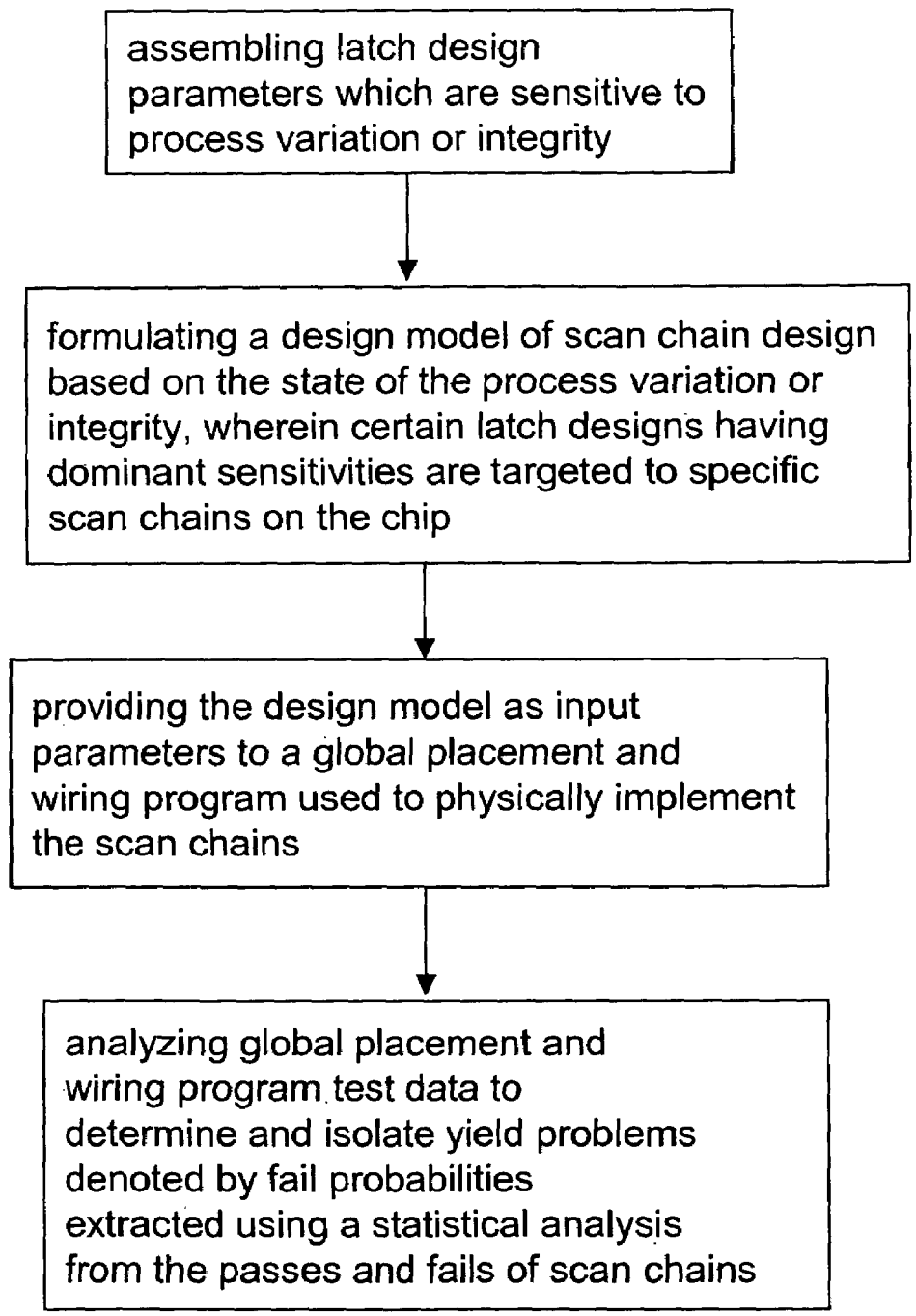
FIG. 8 depicts the methodology for designing scan chains in a semiconductor chip by considering fabrication process sensitivities according to a third embodiment of the invention.

As now described with respect to FIG. 8, the the process sensitive scan chain design and test methodology is as follows:

1. assemble a list of latch and chain design parameters which are sensitive to process variation or integrity, including layer/Level usage==>which layer/level dominates latch (for example, considering inter-latch wiring as a design parameter, one group of latches might use inter-latch wires within dense nestings of surrounding wires, while another group might use lone inter-latch wires with nothing but fill in the neighborhood), via usage, location on chip, scan length, including the latch count and the wire length, critical area, redundant vs. non-redundant elements (i.e. vias), voltage domain, clock domain distribution, and latch type;

2. formulate a model of scan chain design based on current state of yield and process integrity, wherein certain latch designs having dominant sensitivities are chosen for specific scan chains on the chip:

|  | scan chain 1 | scan chain 2 | scan chain 3 |
|---|---|---|---|
| layer usage | x | | |
| via usage | | x | |
| location on chip | | | x |

3. provide the model as input parameters to a global placement and wiring program used to layout the scan chains;

4. analyze test data to determine and isolate systematic yield problems denoted by attributes of a statistically significant failing population of a specific scan chain.

5. An optional step 6 selects a different set of design parameters as the technology or the product climbs the yield curve and secondary problems become first order as the technology or design improves.

The process of optimizing the design may be iterative until a sufficient separation of the design of the scan chains is achieved.

The present invention can be further enhanced by the ability to create sub-segments of individual scan chains, with each sub-segment having specific design sensitivities.

Fail probabilities can be extracted using a statistical analysis from the passes and fails of scan chains, even when those chains are not pure, that is, do not consist of only one latch type and do not exist on only one metal level.

While several embodiments and variations of the present invention for designing scan chains with specific parameter sensitivities to identify process defects are described in detail herein, it should be apparent that the disclosure and teachings of the present invention will suggest many alternative designs to those skilled in the art.

The invention claimed is:

1. A method of designing scan chains in a semiconductor chip by considering fabrication process sensitivities, comprising:

assembling a database of design parameters for the semiconductor chip having fabrication process implications;

selecting one or more of the design parameters for use in designing scan chains on the semiconductor chip;

providing a design model for designing scan chains on the semiconductor chip, based on the selected design parameters, that associates a specific design parameter with a specific scan chain;

employing the design model to create physical scan chain designs for the semiconductor chip.

2. The method of claim 1, including employing the design model in a place and route program to create physical scan chain designs for the semiconductor chip.

3. The method of claim 1, including analyzing scan chain failures for clustering of scan chain failures by similar content.

4. The method of claim 3, including correlating scan chain content back to a process cause based upon said analyzing step to create a list of likely causes of the scan chain failures by using a failure analysis method.

5. The method of claim 1, including assembling latches into scan chains using a combination of constraints of location of latches and scan chain length, with an additional constraint of latch type to maximize uniformity of latch type by scan chain.

6. The method of claim 1, including assembling latches into scan chains while biasing scan chain routing to constrain the scan chain routing to given restricted interconnect layers of the semiconductor chip.

7. The method of claim 6, including dividing scan chains into subsets of scan chains to be routed using restricted interconnect layers of the semiconductor chip, placing a restriction only on subsets of a scan chain rather than on an entire scan chain.

8. The method of claim 1, including analyzing specific fabrication process sensitivities of latch cells and specific chip layer connectivity combinations in the semiconductor chip.

9. The method of claim 1, including revising the design model as the fabrication process matures.

10. A method of designing scan chains in a semiconductor chip by considering fabrication process sensitivities, comprising:
   analyzing specific fabrication process sensitivities of all latch cells and specific chip layer connectivity combinations in the semiconductor chip;
   assembling latches into, scan chains while using a combination of constraints of location of latches and scan chain length, with an additional constraint of latch type to maximize latch type uniformity by scan chain;
   assembling latches into scan chains while biasing scan chain routing to constrain scan chain routing to given restricted interconnect layers of the semiconductor chip;
   analyzing scan chain failures for clustering of scan chain failures by similar content;
   correlating content back to a process cause based upon said scan chain failure analyzing step to create a list of likely causes of the scan chain failures.

11. The method of claim 10, including selecting likely causes of the scan chain failures by using a failure analysis method.

12. The method of claim 10, including dividing scan chains into subsets of scan chains to be routed using restricted interconnect layers of the semiconductor chip, placing a restriction only on subsets of a scan chain rather than on an entire scan chain.

13. The method of claim 12, including optimizing the steps of dividing of subsets and assigning restricted interconnect layers based on a routabiity analysis.

14. The method of claim 10, including optimizing the step of assembling latches into scan chains while using a combination of constraints to balance scan chain content with routability.

15. A method of designing scan chains in a semiconductor chip by considering fabrication process sensitivities, comprising:
   assembling latch design parameters which are sensitive to process variation or integrity;
   formulating a design model of scan chain design based on the state of the process variation or integrity, wherein certain latch designs having dominant sensitivities are targeted to specific scan chains on the chip;
   providing the design model as input parameters to a global placement and wiring program used to physically implement the scan chains;
   analyzing global placement and wiring program test data to determine and isolate yield problems denoted by fail probabilities extracted using a statistical analysis from the passes and fails of scan chains.

16. The method of claim 15, wherein the step of formulating a design model is based on a current state of process.

17. The method of claim 15, wherein the step of formulating a design model is based on a predicted state of process.

18. The method of claim 15, including assembling latches into scan chains using a combination of constraints of location of latches and scan chain length constraints, with an additional constraint of latch type to maximize latch type uniformity by scan chain.

19. The method of claim 15, including assembling latches into scan chains while biasing scan chain routing to constrain scan chain routing to given restricted interconnect layers of the semiconductor chip.

20. The method of claim 19, including dividing scan chains into subsets of scan chains to be routed using restricted interconnect layers of the semiconductor chip, placing a restriction only on subsets of a scan chain rather than on an entire scan chain.

21. The method of claim 15, including analyzing specific fabrication process sensitivities of latch cells of the semiconductor chip and specific chip layer connectivity combinations in the semiconductor chip.

22. The method of claim 15, including revising the design model as the fabrication process matures.

23. The method of claim 15, wherein the step of assembling latch design parameters include parameters of layer usage, which layer dominates a particular type of latch, via usage, location on chip, scan chain length including latch count and wire length, critical area, redundant versus single elements such as vias, adjacent shapes, voltage domain, clock domain distribution, latch types and non-latch circuit element types.

24. The method of claim 23, wherein the single elements include non-redundant elements including vias, voltage domain, clock domain distribution, and latch type.

25. The method of claim 15, including creating sub-segments of individual scan chains, with each sub-segment having specific design sensitivities.

26. The method of claim 15, including extracting fail probabilities using a statistical analysis from the passes and fails of scan chains, even when those scan chains do not consist of only one latch type and so not exist on only one metal layer.

* * * * *